United States Patent
Kim et al.

(10) Patent No.: US 11,177,461 B2
(45) Date of Patent: Nov. 16, 2021

(54) ORGANIC LIGHT EMITTING DIODE DISPLAY

(71) Applicant: SAMSUNG DISPLAY CO., LTD., Yongin-si (KR)

(72) Inventors: Won Jong Kim, Suwon-si (KR); Dong Chan Kim, Gunpo-si (KR); Eung Do Kim, Seoul (KR); Dong Kyu Seo, Hwaseong-si (KR); Da Hea Im, Incheon (KR); Sang Hoon Yim, Suwon-si (KR); Yoon Hyeung Cho, Yongin-si (KR); Won Suk Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 133 days.

(21) Appl. No.: 16/427,978

(22) Filed: May 31, 2019

(65) Prior Publication Data
US 2019/0305254 A1  Oct. 3, 2019

Related U.S. Application Data

(62) Division of application No. 15/087,808, filed on Mar. 31, 2016, now Pat. No. 10,361,400.

(30) Foreign Application Priority Data

Jun. 25, 2015  (KR) .......................... 10-2015-0090722

(51) Int. Cl.
*H01L 51/52* (2006.01)
*H01L 51/00* (2006.01)
(Continued)

(52) U.S. Cl.
CPC ...... *H01L 51/5275* (2013.01); *H01L 51/0061* (2013.01); *H01L 51/0072* (2013.01);
(Continued)

(58) Field of Classification Search
CPC .................................................. H01L 51/5275
See application file for complete search history.

(56) References Cited

U.S. PATENT DOCUMENTS

| | | |
|---|---|---|
| 5,591,500 A | 1/1997 | Kawanishi |
| 5,677,572 A | 10/1997 | Hung et al. |

(Continued)

FOREIGN PATENT DOCUMENTS

| | | |
|---|---|---|
| CN | 101044642 A | 9/2007 |
| CN | 102074568 A | 5/2011 |

(Continued)

OTHER PUBLICATIONS

Machine translation of KR 10-2011-0058126, published on Jun. 1, 2011 (Year: 2011).

(Continued)

*Primary Examiner* — Michael M Dollinger
(74) *Attorney, Agent, or Firm* — Lewis Roca Rothgerber Christie LLP

(57) ABSTRACT

An organic light emitting diode display including: a substrate; an organic light emitting diode on the substrate; a capping layer on the organic light emitting diode and including a high refractive layer including an inorganic material having a refractive index that is equal to or greater than about 1.7 and equal to or less than about 6.0; and a thin film encapsulation layer covering the capping layer and the organic light emitting diode, the inorganic material including at least one selected from the group consisting of CuI, thallium iodide (TlI), BaS, $Cu_2O$, CuO, BiI, $WO_3$, $TiO_2$, AgI, $CdI_2$, $HgI_2$, $SnI_2$, $PbI_2$, $BiI_3$, $ZnI_2$, $MoO_3$, $Ag_2O$, CdO, CoO, $Pr_2O_3$, SnS, PbS, CdS, CaS, ZnS, ZnTe, PbTe, CdTe, SnSe, PbSe, CdSe, AlAs, GaAs, InAs, GaP, InP, AlP, AlSb, GaSb, and InSb.

13 Claims, 5 Drawing Sheets

(51) Int. Cl.
  *H01L 51/50* (2006.01)
  *H01L 27/32* (2006.01)
(52) U.S. Cl.
  CPC ...... *H01L 51/0073* (2013.01); *H01L 51/0074* (2013.01); *H01L 51/5262* (2013.01); *H01L 27/3211* (2013.01); *H01L 51/50* (2013.01); *H01L 51/5253* (2013.01); *H01L 51/5256* (2013.01); *H01L 51/5265* (2013.01); *H01L 2251/5315* (2013.01)

(56) References Cited

U.S. PATENT DOCUMENTS

| | | |
|---|---|---|
| 7,875,895 B2 | 1/2011 | Kwack et al. |
| 8,212,269 B2 | 7/2012 | Karg et al. |
| 9,368,757 B2 | 6/2016 | Choi |
| 10,720,596 B2 | 7/2020 | Cho et al. |
| 2005/0174046 A1 | 8/2005 | Hasegawa et al. |
| 2005/0285510 A1 | 12/2005 | Han et al. |
| 2006/0250084 A1 | 11/2006 | Cok et al. |
| 2008/0169758 A1 | 7/2008 | Cok |
| 2008/0278067 A1 | 11/2008 | Tyan et al. |
| 2008/0296600 A1 | 12/2008 | Kwack et al. |
| 2009/0046368 A1 | 2/2009 | Banerjee et al. |
| 2010/0001301 A1 | 1/2010 | Karg et al. |
| 2011/0121271 A1 | 5/2011 | Jeon et al. |
| 2011/0163330 A1 | 7/2011 | Kim et al. |
| 2011/0309739 A1* | 12/2011 | Song .................. H01L 51/5088 313/504 |
| 2011/0315314 A1 | 12/2011 | Lee et al. |
| 2012/0043881 A1* | 2/2012 | Kuroda .................. G02B 5/045 313/504 |
| 2013/0187141 A1 | 7/2013 | Nakamura et al. |
| 2014/0022480 A1 | 1/2014 | Yokoyama et al. |
| 2014/0023840 A1 | 1/2014 | Shibayama et al. |
| 2014/0103314 A1 | 4/2014 | Satoh et al. |
| 2014/0138636 A1 | 5/2014 | Song |
| 2014/0159023 A1 | 6/2014 | Matsumoto et al. |
| 2014/0264311 A1 | 9/2014 | Lang et al. |
| 2014/0284566 A1 | 9/2014 | Yoo et al. |
| 2014/0367672 A1 | 12/2014 | Kim et al. |
| 2014/0370307 A1 | 12/2014 | Hao et al. |
| 2015/0008422 A1 | 1/2015 | Lee et al. |
| 2015/0090978 A1* | 4/2015 | Yoshida .............. H01L 51/0072 257/40 |
| 2015/0176797 A1 | 6/2015 | Inoue |
| 2015/0277156 A1 | 10/2015 | Kondou |
| 2016/0163341 A1 | 6/2016 | Cao et al. |
| 2016/0329521 A1 | 11/2016 | Kim et al. |
| 2016/0380235 A1 | 12/2016 | Kim et al. |
| 2017/0207421 A1 | 7/2017 | Matsuzaki et al. |
| 2018/0039117 A1 | 2/2018 | Ikeda et al. |
| 2019/0305254 A1 | 10/2019 | Kim et al. |

FOREIGN PATENT DOCUMENTS

| | | |
|---|---|---|
| CN | 102290531 A | 12/2011 |
| CN | 102655164 A | 9/2012 |
| CN | 103534833 | 1/2014 |
| CN | 103682145 A | 3/2014 |
| CN | 104508548 A | 4/2015 |
| CN | 102157543 A | 8/2017 |
| JP | 2009-044104 | 2/2009 |
| KR | 10-2011-0058126 A | 6/2011 |
| KR | 10-2013-0108215 A | 10/2013 |
| KR | 10-2014-0008215 A | 1/2014 |
| KR | 10-2014-0038656 | 3/2014 |
| KR | 10-2014-0064349 A | 5/2014 |
| TW | 201411833 A | 3/2014 |
| WO | WO 2012/157211 A1 | 11/2012 |
| WO | 2013/161602 A1 | 10/2013 |
| WO | 2014/017363 A1 | 1/2014 |
| WO | 2014/041743 A1 | 3/2014 |

OTHER PUBLICATIONS

U.S. Office Action dated Apr. 6, 2020, issued in U.S. Appl. No. 16/417,386 (15 pages).
U.S. Office action dated Nov. 27, 2020, issued in U.S. Appl. No. 16/417,386 (12 pages).
Magnesium Fluoride (MgF2), Janos Technology, Retrieved from the Internet on Jun. 5, 2018 (identical to the 2017 version cited by the Examiner in the Jul. 20, 2017 Office Action issued in U.S. Appl. No. 14/985,285).
U.S. Office Action dated Jul. 20, 2017, issued in U.S. Appl. No. 14/985,285 (17 pages).
U.S. Final Office Action dated Nov. 30, 2017, issued in U.S. Appl. No. 14/985,285 (16 pages).
U.S. Office Action dated Apr. 6, 2018, issued in U.S. Appl. No. 14/985,285 (17 pages).
Machine translation of CN 102157543 A, published on Aug. 17, 2011 (Year: 2011).
U.S. Notice of Allowance dated Jan. 10, 2019, issued in U.S. Appl. No. 14/985,285 (9 pages).
Machine translation of KR 10-2013-0108215, published on Oct. 2, 2013 (Year: 2013).
U.S. Final Office action dated Mar. 11, 2021, issued in U.S. Appl. No. 16/417,386 (15 pages).
U.S. Office action dated Jul. 14, 2021, issued in U.S. Appl. No. 16/417,386 (22 pages).

* cited by examiner

ORGANIC LIGHT EMITTING DIODE DISPLAY

CROSS-REFERENCE TO RELATED APPLICATIONS

This application is a divisional of U.S. patent application Ser. No. 15/087,808, filed on Mar. 31, 2016, which claims priority to and the benefit of Korean Patent Application No. 10-2015-0090722, filed on Jun. 25, 2015 in the Korean Intellectual Property Office, the entire content of each of which is incorporated herein by reference.

BACKGROUND

1. Field

Aspects of embodiments of the present disclosure relate to an organic light emitting diode display.

2. Description of the Related Art

The recent trend toward lightweight and thin personal computers and television sets necessitates lightweight and thin display devices, and flat panel displays (e.g., a liquid crystal display (LCD)) satisfying such requirements are being substituted for conventional cathode ray tubes (CRTs). However, since an LCD is a passive display device, an additional backlight is needed as a light source, and LCDs have various problems, such as a slow response time and a narrow viewing angle.

In this regard, an organic light emitting diode (OLED) display has recently been highlighted as a self-emissive display device with advantages of a wide viewing angle, outstanding contrast, and a fast response time.

The OLED display includes organic light emitting diodes for emitting light, and in the OLEDs, electrons injected from one electrode and holes injected from another electrode are combined with each other in a light emitting layer, thereby generating excitons, and energy is outputted from the excitons to emit light.

Currently, various methods that can improve light efficiency by effectively extracting light that is generated in the organic light emitting layer are necessitated.

The above information disclosed in this Background section is only to enhance the understanding of the background of the disclosure and therefore it may contain information that does not form the prior art that is already known in this country to a person of ordinary skill in the art.

SUMMARY

According to an aspect of embodiments of the present disclosure, an organic light emitting diode display has improved light efficiency.

According to one or more exemplary embodiments of the present disclosure, an organic light emitting diode display includes: a substrate; an organic light emitting diode on the substrate; a capping layer on the organic light emitting diode and including a high refractive layer including an inorganic material having a refractive index that is equal to or greater than about 1.7 and equal to or less than about 6.0; and a thin film encapsulation layer covering the capping layer and the organic light emitting diode, and the inorganic material may include at least one selected from the group consisting of CuI, thallium iodide (TlI), BaS, $Cu_2O$, CuO, BiI, $WO_3$, $TiO_2$, AgI, $CdI_2$, $HgI_2$, $SnI_2$, $PbI_2$, $BiI_3$, $ZnI_2$, $MoO_3$, $Ag_2O$, CdO, CoO, $Pr_2O_3$, SnS, PbS, CdS, CaS, ZnS, ZnTe, PbTe, CdTe, SnSe, PbSe, CdSe, AlAs, GaAs, InAs, GaP, InP, AlP, AlSb, GaSb, and InSb.

The capping layer may include a top layer directly below the thin film encapsulation layer, the thin film encapsulation layer may include a base layer directly on the capping layer, and the top layer and the base layer may have different refractive indexes.

The thin film encapsulation layer may include a first encapsulation layer on the base layer, a second encapsulation layer on the first encapsulation layer, and a third encapsulation layer on the second encapsulation layer; the first encapsulation layer may be an inorganic layer; the second encapsulation layer may be an organic layer; and the third encapsulation layer may be an inorganic layer.

The base layer may include at least one selected from the group consisting of LiF, SiOx, SiC, $MgF_2$, $AlF_3$, and NaF.

The first encapsulation layer may include at least one selected from the group consisting of SiON, $TiO_2$, and SiNx.

The third encapsulation layer may include at least one selected from the group consisting of SiON, SiNx, and $TiO_2$.

The capping layer may further include a low refraction layer formed of an inorganic material with a refractive index that is equal to or greater than about 1.0 and equal to or less than about 1.7.

The low refraction layer may be disposed between the high refractive layer and the organic light emitting diode.

The low refraction layer may include an inorganic material that includes a halogen compound.

The low refraction layer may include at least one selected from the group consisting of $MgF_2$, LiF, $AlF_3$, and NaF.

The low refraction layer may include at least one low refraction layer, and the high refractive layer may include at least one high refractive layer, and the capping layer may have a structure in which the low refraction layer and the high refractive layer are alternately stacked.

The organic light emitting diode may include a first electrode and a second electrode facing each other, and a light-emitting layer between the first electrode and the second electrode, and the capping layer may be directly on the second electrode.

The first electrode may be formed as a reflective layer.

The thin film encapsulation layer may be formed to cover a lateral surface of the capping layer.

The light-emitting layer may include a red light-emitting layer, a green light-emitting layer, a blue light-emitting layer, and an auxiliary layer that is below the blue light-emitting layer.

The organic light emitting diode display may further include a red resonant auxiliary layer below the red light-emitting layer and a green resonant auxiliary layer below the green light-emitting layer.

The auxiliary layer may include a compound represented by Chemical Formula 1.

Chemical Formula 1

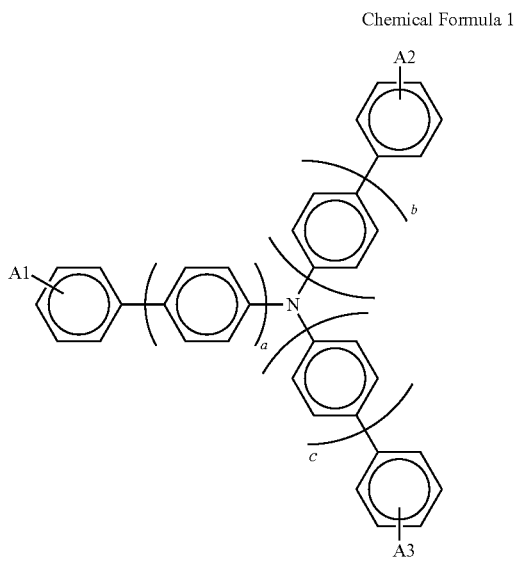

In Chemical Formula 1, A1, A2, and A3 are each an alkyl group, an aryl group, carbazole, dibenzothiophene, dibenzofuran (DBF), and biphenyl, and a, b, and c are each positive numbers of zero to four.

The auxiliary layer may include a compound represented by Chemical Formula 2.

Chemical Formula 2

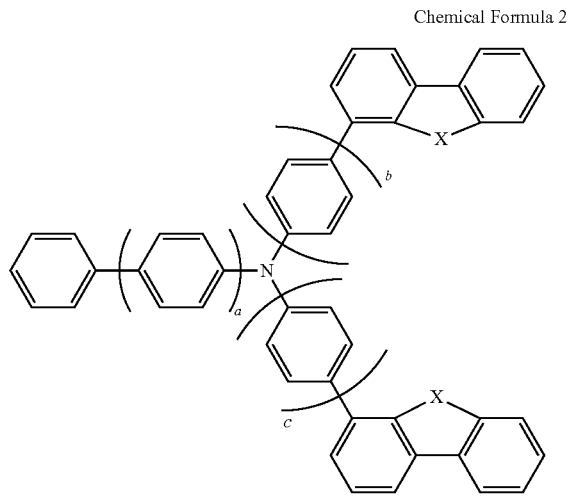

In Chemical Formula 2, a may be 0 to 3, b and c may respectively be 0 to 3, X may be selected from O, N, or S, and each X may be the same as the other or different than the other.

According to an aspect of embodiments of the present disclosure, light efficiency of an organic light emitting diode display is improved by forming a capping layer with an inorganic material that has a high refractive index. Further, according to an aspect of embodiments of the present disclosure, light efficiency is improved by providing a top layer of a capping layer and a base layer of a thin film encapsulation layer having different refractive indexes.

DETAILED DESCRIPTION

Figure 1:
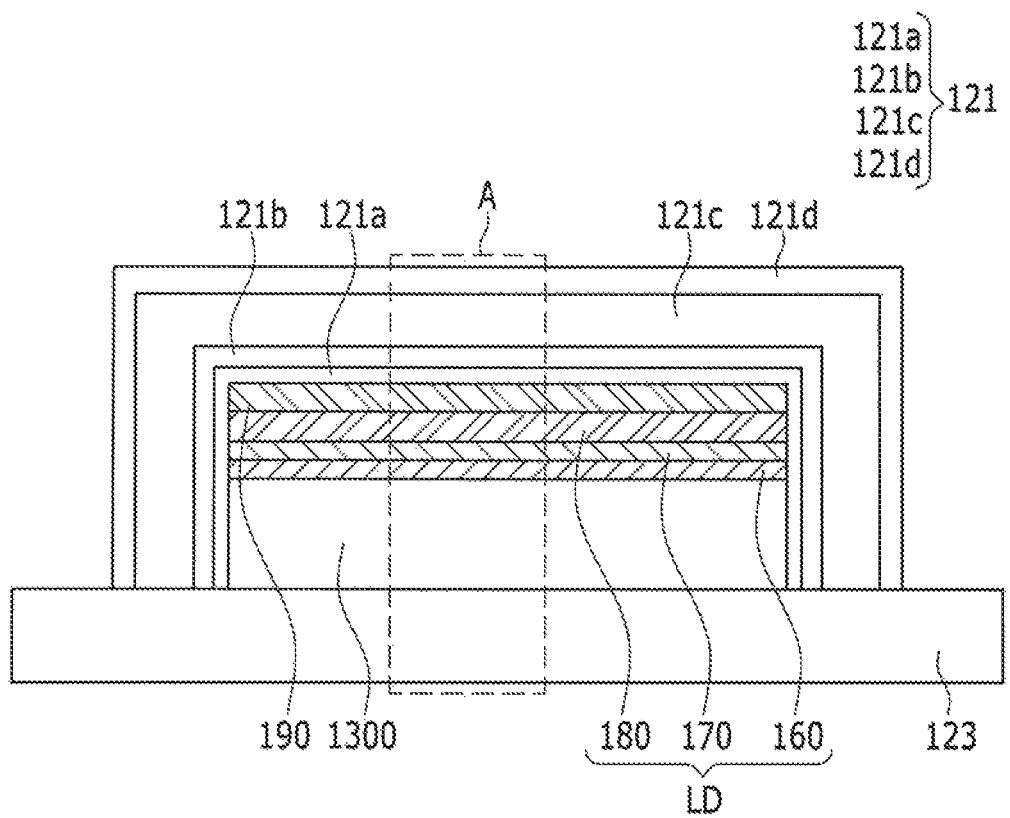
FIG. 1 illustrates a cross-sectional view of an organic light emitting diode display according to an exemplary embodiment of the present disclosure.

Aspects and features of the present disclosure will be described more fully hereinafter with reference to the accompanying drawings, in which some exemplary embodiments of the disclosure are shown. However, it is to be understood that the disclosure is not limited to the disclosed embodiments, but, on the contrary, is intended to cover various modifications. As those skilled in the art would realize, the described embodiments may be modified in various different ways, all without departing from the spirit or scope of the present disclosure.

In the drawings, the thickness of layers, films, panels, regions, etc., may be exaggerated for clarity. It will be understood that when an element such as a layer, film, region, or substrate is referred to as being "on" another element, it can be directly on the other element or intervening elements may also be present. Like reference numerals designate like elements throughout the specification.

Figure 2:
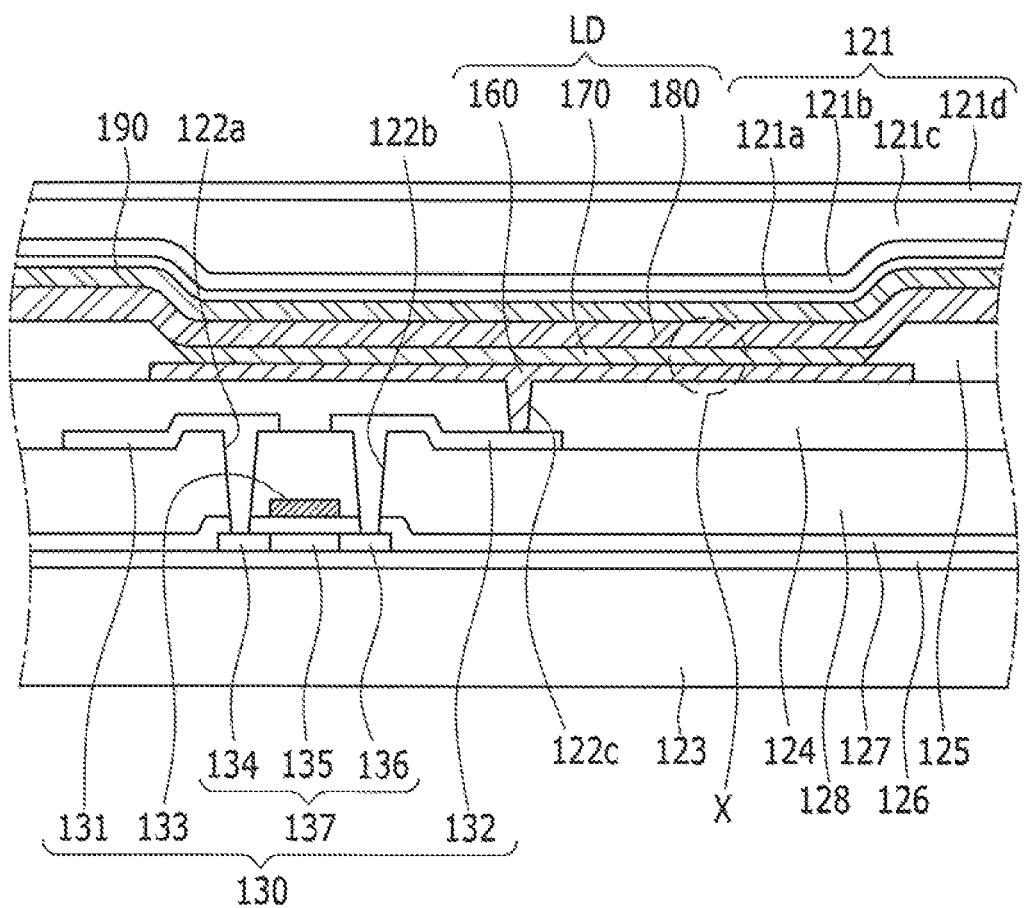
FIG. 2 illustrates an enlarged cross-sectional view in which a region "A" of FIG. 1 is shown enlarged.
Figure 3:
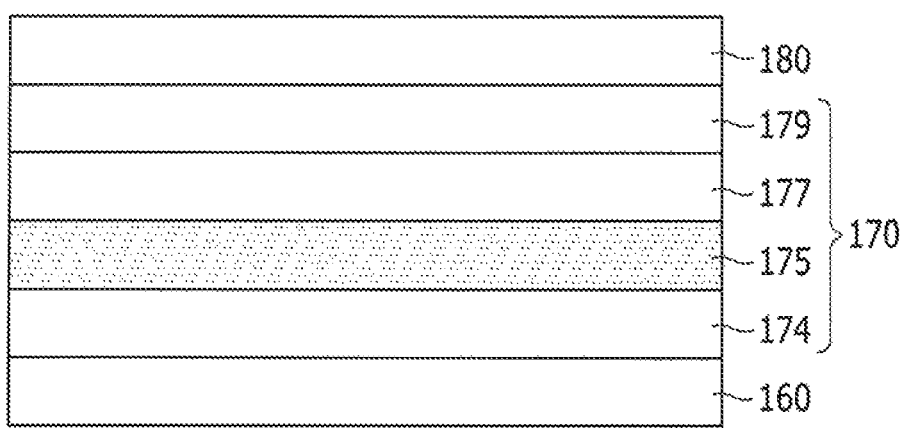
FIG. 3 illustrates an enlarged cross-sectional view of an organic light emitting diode in which a region "X" of FIG. 2 is shown enlarged.

FIG. 1 illustrates a cross-sectional view of an organic light emitting diode display according to an exemplary embodiment of the present disclosure. FIG. 2 illustrates an enlarged cross-sectional view in which a region "A" of FIG. 1 is shown enlarged. FIG. 3 illustrates an enlarged cross-sectional view of an organic light emitting diode in which a region "X" of FIG. 2 is shown enlarged.

Referring to FIG. 1, an organic light emitting diode display according to an exemplary embodiment of the present disclosure includes a substrate 123, a thin film transistor element layer 1300 disposed on the substrate 123 and including a gate line, a data line, a thin film transistor, an interlayer insulating layer, and the like, and an organic light emitting diode LD disposed on the thin film transistor element layer 1300. The organic light emitting diode LD includes a first electrode 160, a light-emitting diode layer 170, and a second electrode 180. The first electrode 160 may be a hole injection electrode and the second electrode 180 may be an electron injection electrode. A hole supplied through the first electrode 160 and an electron supplied through the second electrode 180 are combined in the light-emitting diode layer 170 to generate light. In contrast, the first electrode 160 may be an electron injection electrode and the second electrode 180 may be a hole injection electrode. An electron supplied through the first electrode 160 and a hole supplied through the second electrode 180 are combined in the light-emitting diode layer 170 to generate light.

In order to further adjust light characteristics such as efficiency and a viewing angle of the organic light emitting diode LD, a capping layer 190 for the organic light emitting diode LD is provided. Since the organic light emitting diode LD is very vulnerable to a gas such as oxygen or moisture, a thin film encapsulation layer 121, in one embodiment, is disposed to surround an upper surface and a lateral surface of the capping layer 190 so as to prevent or substantially prevent external air or moisture from permeating into the organic light emitting diode LD.

A stacked structure of the organic light emitting diode display according to an exemplary embodiment of the present disclosure will now be described in further detail with reference to FIGS. 2 and 3.

Referring to FIGS. 2 and 3, the organic light emitting diode display according to an exemplary embodiment of the present disclosure includes the substrate 123, a thin film transistor 130, the first electrode 160, the light-emitting diode layer 170, and the second electrode 180. The first electrode 160 may be an anode and the second electrode 180 may be a cathode, or, alternatively, the first electrode 160 may be a cathode and the second electrode 180 may be an anode.

The substrate 123 may be made of an inorganic material such as glass, an organic material such as polycarbonate, polymethyl methacrylate, polyethylene terephthalate, polyethylene naphthalate, polyamide, polyether sulfone, or a combination thereof, or a silicon wafer.

A substrate buffer layer 126 may be disposed on the substrate 123. The substrate buffer layer 126 serves to prevent or substantially prevent penetration of impurity elements and to flatten a surface.

In this case, the substrate buffer layer 126 may be made of any of a variety of materials that can perform the above-described functions. For example, any of a silicon nitride (SiNx) layer, a silicon oxide (SiOy) layer, and a silicon oxynitride (SiOyNx) layer may be used as the substrate buffer layer 126. However, in another embodiment, since the substrate buffer layer 126 is not an integral component, it may be omitted depending on a kind of the substrate 123 and a processing condition.

A driving semiconductor layer 137 is formed on the substrate buffer layer 126. The driving semiconductor layer 137 is formed of a material including polysilicon. In addition, the driving semiconductor layer 137 includes a channel area 135 in which impurities are not doped, and a source area 134 and a drain area 136 in which impurities are doped at opposite sides of the channel area 135. In this case, doped-ion materials are P-type impurities such as boron (B), and $B_2H_6$ may be used. In this case, impurities may be dependent on kinds of thin film transistors.

A gate insulating layer 127 that is made of a silicon nitride (SiNx) or a silicon oxide (SiOy) is formed on the driving semiconductor layer 137. A gate line including a driving gate electrode 133 is formed on the gate insulating layer 127. In addition, the driving gate electrode 133 may be formed to overlap at least some of the driving semiconductor layer 137, and specifically, the channel region 135.

An interlayer insulating layer 128 covering the driving gate electrode 133 is formed on the gate insulating layer 127. First and second contact holes 122a and 122b exposing the source and drain regions 134 and 136 of the driving semiconductor layer 137 are formed in the gate insulating layer 127 and the interlayer insulating layer 128. The interlayer insulating layer 128 may be made of a silicon nitride (SiNx) or a silicon oxide (SiOy), as may be the gate insulating layer 127.

In addition, a data line including a driving source electrode 131 and a driving drain electrode 132 may be disposed on the interlayer insulating layer 128. The driving source electrode 131 and the driving drain electrode 132 are connected to the source and drain regions 134 and 136, respectively, of the driving semiconductor layer 137 via the first and second contact holes 122a and 122b that are respectively formed in the interlayer insulating layer 128 and the gate insulating layer 127.

As such, the driving thin film transistor 130 is formed by including the driving semiconductor layer 137, the driving gate electrode 133, the driving source electrode 131, and the driving drain electrode 132. However, in other embodiments, the configuration of the driving thin film transistor 130 is not limited to the example described above, and can be modified in various ways to have any of suitable configurations that can be easily practiced by those skilled in the art.

In addition, a planarization layer 124 covering the data line is formed on the interlayer insulating layer 128. The planarization layer 124 serves to eliminate or reduce and flatten a step to increase luminous efficiency of the organic light emitting diode to be formed thereon. The planarization layer 124 includes a third contact hole 122c that exposes a portion of the drain electrode 132.

The planarization layer 124 may be made of one or more of a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

Here, the exemplary embodiment according to the present disclosure is not limited to the structure described above, and, in one embodiment, either of the planarization layer 124 and the interlayer insulating layer 128 may be omitted.

In this case, the first electrode 160 corresponding to a pixel electrode of the organic light emitting diode LD is formed on the planarization layer 124. That is, the organic light emitting diode display includes the plurality of first electrodes 160 that are respectively disposed in a plurality of pixels. In this case, the first electrodes 160 are disposed to be spaced apart from each other. The first electrode 160 is connected to the drain electrode 132 via the third contact hole 122c of the planarization layer 124.

Pixel definition layers 125 including an opening exposing the first electrode 160 are formed on the planarization layer 124. That is, a plurality of openings corresponding to each of the pixels is formed between the pixel definition layers 125. In this case, a light-emitting diode layer 170 may be disposed in each of the openings that are formed by the pixel definition layer 125. Accordingly, a pixel area in which each of organic light-emitting layers are formed may be defined by the pixel definition layer 125.

In this case, the first electrode 160 is disposed to correspond to the openings of the pixel definition layer 125. However, the first electrode 160 may not necessarily be disposed only in the opening of the pixel definition layer 125, but may be disposed below the pixel definition layer 125 such that some of the first electrode 160 overlaps the pixel definition layer 125.

The pixel definition layer 125 may be made of a polyacrylate-based resin and a polyimide-based resin, or a silica-based inorganic material.

The light-emitting diode layer 170 is formed on the first electrode 160. A structure of the light-emitting diode layer 170 is described further below.

The second electrode 180 corresponding to a common electrode may be formed on the light-emitting diode layer 170. As such, the organic light emitting diode LD including the first electrode 160, the light-emitting diode layer 170, and the second electrode 180 is formed.

The first electrode 160 and the second electrode 180 may be respectively made of a transparent conductive material or a transflective or reflective conductive material. Depending on kinds of materials for forming the first electrode 160 and the second electrode 180, the organic light emitting diode display may be a top emission type, a bottom emission type, or a dual emission type. In the organic light emitting diode display according to the present exemplary embodiment, the first electrode 160 is formed as a reflective layer and the second electrode 180 is formed as a transflective layer, such that light generated by the light-emitting diode layer 170 may pass through the second electrode 180 to be outputted outside. In other words, the organic light emitting diode display of the present exemplary embodiment may include a top emission type of cavity structure.

The second electrode 180 included in the organic light emitting diode according to an exemplary embodiment of the present disclosure may include at least one selected from the group consisting of Ag, Al, Mg, Cr, Mn, Fe, Co, Ni, Cu, In, Sn, Ru, Mo, and Nb. The second electrode 180 of the present exemplary embodiment may be deposited by sputtering.

The capping layer 190 is disposed on the second electrode 180 to cover and protect the second electrode 180. In the present exemplary embodiment, the capping layer 190 includes an inorganic material with a refractive index which is equal to or greater than about 1.7 and equal to or less than about 6.0. In the present exemplary embodiment, the inorganic material forming the capping layer 190 may include a material selected from CuI, thallium iodide (TlI), BaS, $Cu_2O$, CuO, BiI, and $WO_3$. Specifically, the inorganic material such as CuI, BiI, or TlI is a high refractive material, which is capable of thermal evaporation at a temperature of less than about 500 degrees Celsius and is capable of deposition by a thermal evaporation method at a relatively low temperature, thereby strengthening a cavity without changing electrical characteristics with respect to the organic light emitting diode LD. Accordingly, when the capping layer 190 is formed of the inorganic material such as CuI, BiI, or TlI, light efficiency may be improved without changing electrical characteristics of the organic light emitting diode LD.

The capping layer 190 is not limited to the above-described exemplary embodiment, and the capping layer 190 may include at least one selected from $TiO_2$, AgI, $CdI_2$, $HgI_2$, $SnI_2$, $PnI_2$, $BiI_3$, $ZnI_2$, $MoO_3$, $Ag_2O$, CdO, CoO, $Pr_2O_3$, SnS, PbS, CdS, CaS, ZnS, ZnTe, PbTe, CdTe, SnSe, PbSe, CdSe, AlAs, GaAs, InAs, GaP, InP, AlP, AlSb, GaSb, and InSb.

The capping layer 190 shown in FIGS. 1 and 2 is described as a single layer, but the present disclosure is not limited thereto, and the capping layer 190 may include two or more layers, which will be described further later.

The thin film encapsulation layer 121 is formed on the capping layer 190. The thin film encapsulation layer 121 seals and protects the organic light emitting diode LD and a driving circuit unit, which are formed on the substrate 123, from the outside.

In one embodiment, the thin film encapsulation layer 121 includes a base layer 121a, a first encapsulation layer 121b, a second encapsulation layer 121c, and a third encapsulation layer 121d that are stacked on one another. The base layer 121a is directly disposed on the capping layer 190 to contact an upper surface of the capping layer 190. The base layer 121a according to the present exemplary embodiment may have a refractive index different from that of the capping layer 190. For example, as described above, when the capping layer 190 is formed as a high refraction layer, the base layer 121a may be formed as a low refraction layer. The base layer 121a formed as the low refraction layer may include any of LiF, SiOx, SiC, Mg $F_2$, $AlF_3$, and NaF.

A capping layer 190 according to a modified exemplary embodiment of the present disclosure may be formed of an organic material such as Balq having a low refractive index equal to or less than about 1.7 or an inorganic material such as $AlF_3$, and, in this case, the base layer 121a may include a material selected from SiNx, $TiO_2$, CuI, and TlI.

In one embodiment, the first encapsulation layer 121b, the second encapsulation layer 121c, and the third encapsulation layer 121d are sequentially stacked on the base layer 121a. According to the present exemplary embodiment, the first encapsulation layer 121b may be an inorganic layer, the second encapsulation layer 121c may be an organic layer, and the third encapsulation layer 121d may be an inorganic layer. The first encapsulation layer 121b may include at least one selected from the group consisting of SiON, $TiO_2$, and SiNx, and the third encapsulation layer 121d may include at least one selected from the group consisting of SiON, SiNx, and $TiO_2$. An oxide or nitride such as SiON or SiNx included in the first encapsulation layer 121b may be deposited by a chemical vapor deposition method, and an oxide such as $TiO_2$ included in the first encapsulation layer 121b may be deposited by an atomic layer deposition method. In the present exemplary embodiment, although the first encapsulation layer 121b is formed as a single layer, the first encapsulation layer 121b may be formed as a two-layered structure including a lower layer and an upper layer. In this case, each of the lower layer and the upper layer may include a material selected from SiON, $TiO_2$, and SiNx.

An organic light emitting diode according to an exemplary embodiment of the present disclosure will now be described with reference to FIG. 3.

Referring to FIG. 3, an organic light emitting diode (shown at region "X" of FIG. 2) according to an exemplary embodiment of the present disclosure includes a structure in which the first electrode 160, a hole-transporting layer 174, a light-emitting layer 175, an electron-transporting layer 177, an electron injection layer 179, and the second electrode 180 are sequentially stacked.

When the first electrode 160 is an anode, a material selected from materials having a high work function may be selected for injection of holes. The first electrode 160 may be a transparent electrode or an opaque electrode. When the first electrode 160 is a transparent electrode, it may be made of indium-tin oxide (ITO), indium-zinc oxide (IZO), tin oxide ($SnO_2$), zinc oxide (ZnO), or a combination thereof, which is a conductive oxide, or a metal such as aluminum, silver, and magnesium, with a thin thickness. When the first electrode 160 is an opaque electrode, it may be made of a metal, such as aluminum, silver, or magnesium.

The first electrode 160 may be formed in a two or more-layered structure including different kinds of materials. For example, the first electrode 160 may be formed to have a structure in which indium-tin oxide (ITO)/silver (Ag)/indium-tin oxide (ITO) are sequentially stacked.

The first electrode 160 may be formed by sputtering or vacuum deposition.

The hole-transporting layer 174 is disposed on the first electrode 160. The hole-transporting layer 174 may serve to smoothly transport holes transmitted from a hole injection layer (not shown). The hole-transporting layer 174 may include an organic material. For example, the hole-transporting layer 174 may include NPD (N,N-dinaphthyl-N,N'-diphenyl benzidine), TPD (N,N'-bis-(3-methylphenyl)-N, N'-bis-(phenyl)-benzidine), s-TAD, MTDATA (4,4',4"-tris(N-3-methylphenyl-N-phenyl-amino)-triphenylamine), etc., but is not limited thereto.

In this case, the thickness of the hole-transporting layer 174 may be about 15 nm to about 25 nm. In an exemplary embodiment, the thickness of hole-transporting layer 174 may be about 20 nm. The hole-transporting layer and the hole-injection layer may be formed to be a single layer by modifying the above-described hole-transporting layer 174 and including a hole injecting material in the hole-transporting layer 174.

The light-emitting layer 175 is disposed on the hole-transporting layer 174. The light-emitting layer 175 includes a light-emitting material that represents a specific color. For example, the light-emitting layer 175 may display a basic color such as blue, green, or red, or a combination thereof.

The thickness of the light-emitting layer 175 may be about 10 nm to about 50 nm. The light-emitting layer 175 includes a host and a dopant. The light-emitting layer 175 may include a material that emits red light, green light, blue light, and white light, and may be formed using a phosphorescent or fluorescent material.

When emitting red light, the light-emitting layer 175 includes a host material that includes CBP (carbazole biphenyl) or mCP (1,3-bis(carbazol-9-yl), and may be made of a phosphorescent material including a dopant including at least one selected from PIQIr(acac) (bis(1-phenylisoquinoline)acetylacetonate iridium), PQIr(acac) (bis(1-phenylquinoline)acetylacetonate iridium), PQIr(tris(1-phenylquinoline)iridium), and PtOEP (octaethylporphyrin platinum), or, alternatively, may be made of a fluorescent material including PBD:Eu(DBM)3(Phen) or perylene, but is not limited thereto.

When emitting green light, the light-emitting layer 175 includes a host material that includes CBP or mCP, and may be made of a phosphorescent material that includes a dopant material including Ir(ppy)3(fac-tris(2-phenylpyridine) iridium), or alternatively, may be made of a fluorescent material including Alq3(tris(8-hydroxyquinolino)aluminum), but it is not limited thereto.

When emitting blue light, the light-emitting layer 175 includes a host material including CBP or mCP, and may be made of a phosphorescent material that includes a dopant material including (4,6-F2ppy)2Irpic. Alternatively, the light-emitting layer 175 may be made of a fluorescent material including at least one selected from a group of spiro-DPVBi, spiro-6P, distyryl benzene (DSB), distyrylarylene (DSA), a PFO-based polymer, and a PPV-based polymer, but is not limited thereto.

The electron-transporting layer 177 is disposed on the light-emitting layer 175. The electron-transporting layer 177 may transmit electrons from the second electrode 180 to the light-emitting layer 175. Further, the electron-transporting layer 177 can prevent or substantially prevent holes injected from the first electrode 160 from moving to the second electrode 180 through the light-emitting layer 175. That is, the electron-transporting layer 177 functions as a hole-blocking layer to help combination of the holes and electrons in the light-emitting layer 175.

In this case, the electron-transporting layer 177 may include an organic material. For example, the electron-transporting layer 177 may include at least one selected from the group consisting of Alq3 (tris(8-hydroxyquinolino)-aluminum), PBD, TAZ, spiro-PBD, BAlq, and SAlq, but is not limited thereto.

The electron injection layer 179 is disposed on the electron-transporting layer 177. The electron injection layer 179 serves to enhance electron injection to the electron-transporting layer 177 from the second electrode 180. In the present exemplary embodiment, the electron injection layer 179 includes a dipole material and a first metal. In one embodiment, the dipole material and the first metal are co-deposited to form one layer. The first metal may include at least one selected from the group consisting of Yb, Mg, Li, Na, Ca, Sr, Ba, In, Sn, La, Ce, Pr, Nd, Pm, Eu, Gd, Tb, Dy, Ho, Er, Sm, and Lu.

The dipole material consists of a first component and a second component of different polarities, which are combined with each other, and the first component may include one selected from an alkali metal, an alkali earth metal, a rare-earth metal, and a transition metal, and the second component may include a halogen. The first component may be an element including at least one selected from the group consisting of Li, Na, K, Rb, Cs, Be, Mg, Ca, Sr, and Ba, and the second component may be an element including at least one selected from the group consisting of F, Cl, Br, and I. Here, the first component is an element that becomes a cation when the dipole material is ionized, and the second component may be an element that becomes an anion.

In the present exemplary embodiment, the thickness of the electron injection layer 179 is at least about 5 angstroms (Å) considering a process margin and has a maximum value of about 50 angstroms (Å) by considering the difficulty as a function of the electron injection layer, and thereby a range thereof may be about 5 angstroms (Å) to about 50 angstroms (Å). In one embodiment, the thickness of the electron injection layer is about 10 angstroms (Å) to about 20 angstroms (Å).

The second electrode 180 is disposed on the electron injection layer 179. The second electrode 180 included in the organic light emitting diode according to the exemplary embodiment of the present disclosure includes at least one selected from the group consisting of Ag, Al, Mg, Cr, Mn, Fe, Co, Ni, Cu, In, Sn, Ru, Mo, and Nb. The thickness of the second electrode 180, which is a common electrode, may be about 30 angstroms (Å) to about 300 angstroms (Å). In the present exemplary embodiment, the second electrode 180 may be deposited by sputtering.

Figure 4:
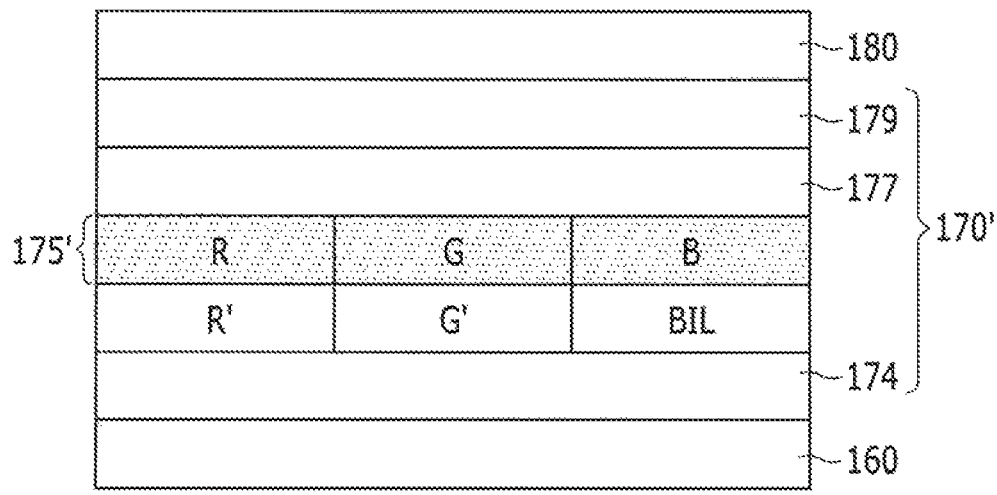
FIG. 4 illustrates a cross-sectional view of another exemplary embodiment in which the organic light emitting diode of FIG. 3 is partially modified.

FIG. 4 illustrates a cross-sectional view of another exemplary embodiment in which the organic light emitting diode of FIG. 3 is partially modified.

Referring to FIG. 4, a shape in which a light-emitting layer 175' of a light-emitting diode layer 170' of an organic light emitting diode is modified from that of the light-emitting layer 175 described with reference to FIG. 3 is shown. That is, in the present exemplary embodiment, the light-emitting layer 175' includes a red light-emitting layer (R), a green light-emitting layer (G), and a blue light-emitting layer (B), and an auxiliary layer (BIL) may be disposed below the blue light-emitting layer (B) such that efficiency of the blue light-emitting layer (B) may be improved.

The red light-emitting layer (R) may be about 30 nm to about 50 nm thick, the green light-emitting layer (G) may be about 10 nm to about 30 nm thick, and the blue light-emitting layer (B) may be about 10 nm to about 30 nm thick. The auxiliary layer (BIL) disposed below the blue-light emitting layer (B) may be equal to or less than about 20 nm thick. The auxiliary layer (BIL) may improve the efficiency of the blue light-emitting layer (B) by adjusting hole charge balance. The auxiliary layer (BIL) may include a compound represented by Chemical Formula 1.

Chemical Formula 1

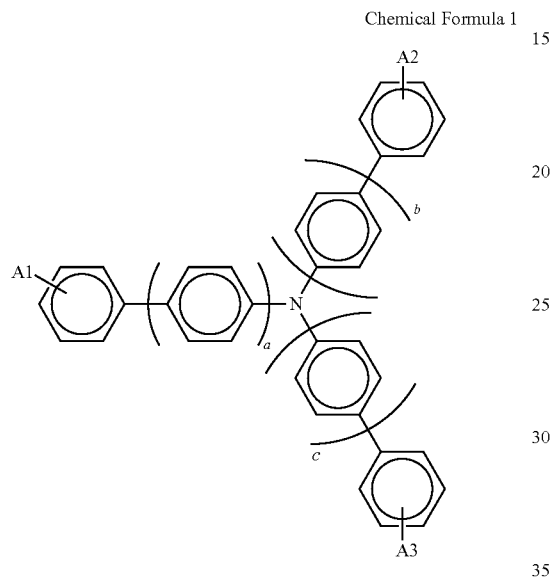

In Chemical Formula 1, A1, A2, and A3 are each an alkyl group, an aryl group, carbazole, dibenzothiophene, dibenzofuran (DBF), and biphenyl, and a, b, and c are each positive numbers of zero to four.

As an example of the compounds represented by Chemical Formula 1, the following Chemical Formulas 1-1, 1-2, 1-3, 1-4, 1-5, and 1-6 may be included.

Chemical Formula 1-1

Chemical Formula 1-2

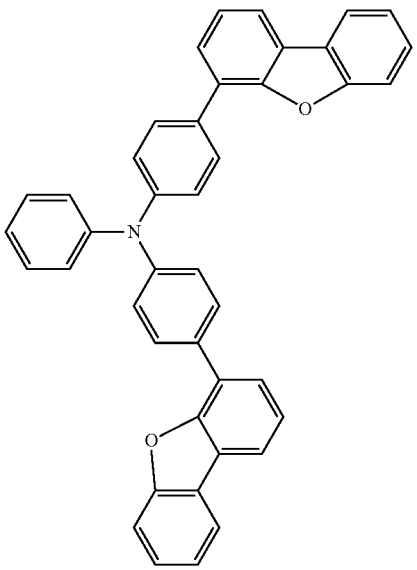

Chemical Formula 1-3

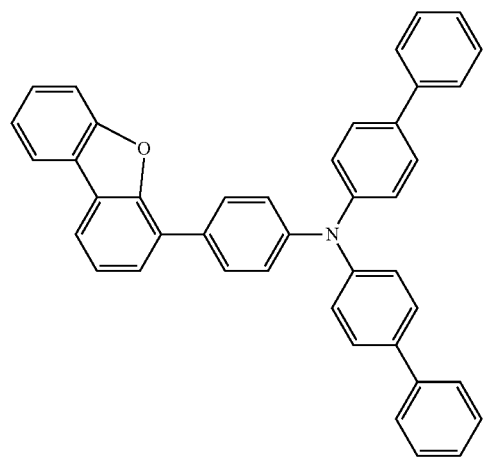

Chemical Formula 1-4

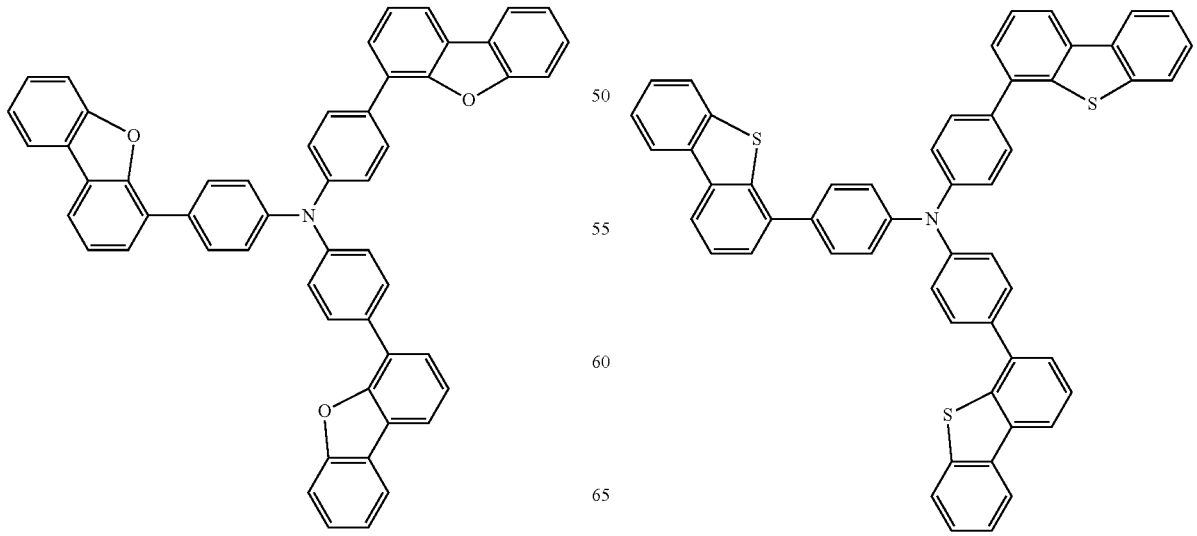

Chemical Formula 1-5

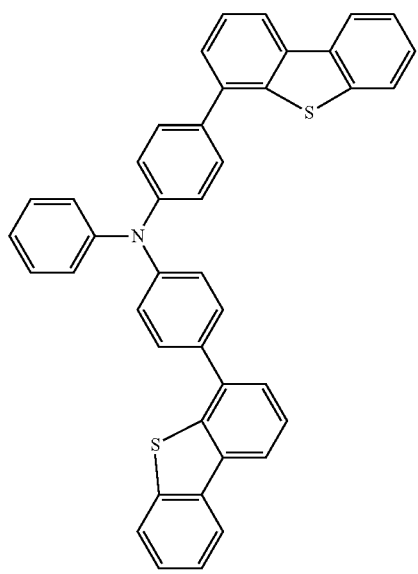

Chemical Formula 1-6

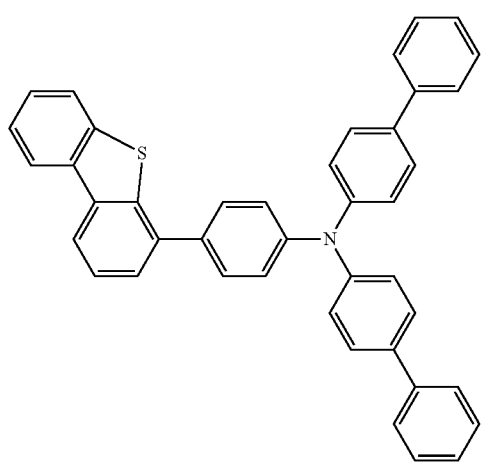

In another exemplary embodiment, the auxiliary layer (BIL) may include a compound represented by Chemical Formula 2.

Chemical Formula 2

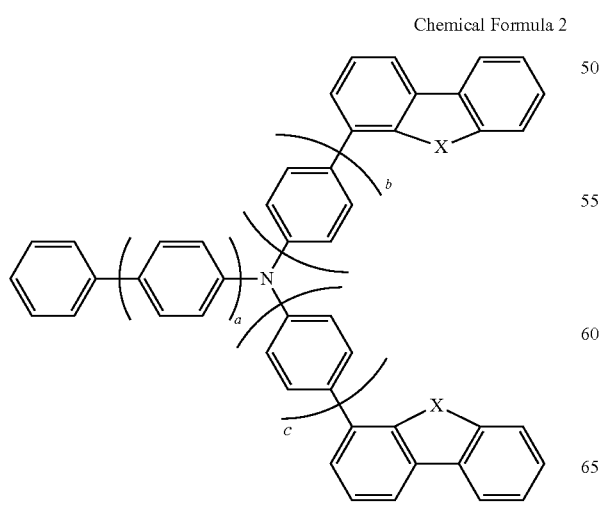

In Chemical Formula 2, a may be 0 to 3, b and c may respectively be 0 to 3, X may be selected from O, N, or S, and each X may be the same as the other or different than the other.

As an example of the compound represented by Chemical Formula 2, Chemical Formulas 2-1, 2-2, 2-3, 2-4, 2-5, and 2-6 may be included.

Chemical Formula 2-1

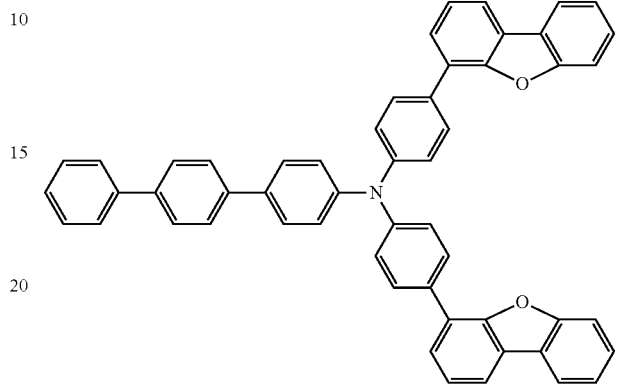

Chemical Formula 2-2

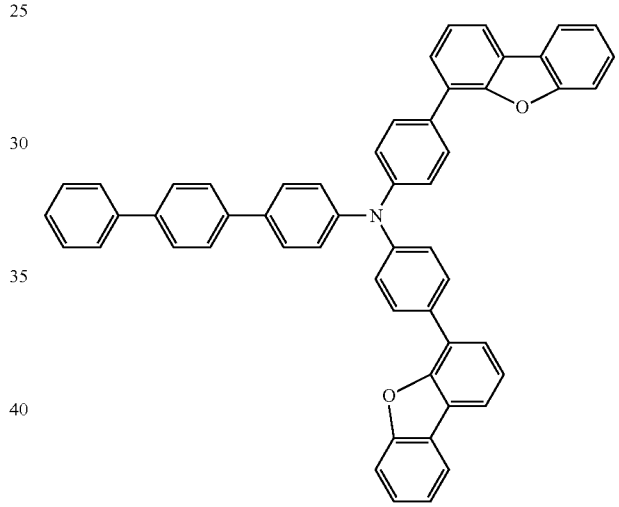

Chemical Formula 2-3

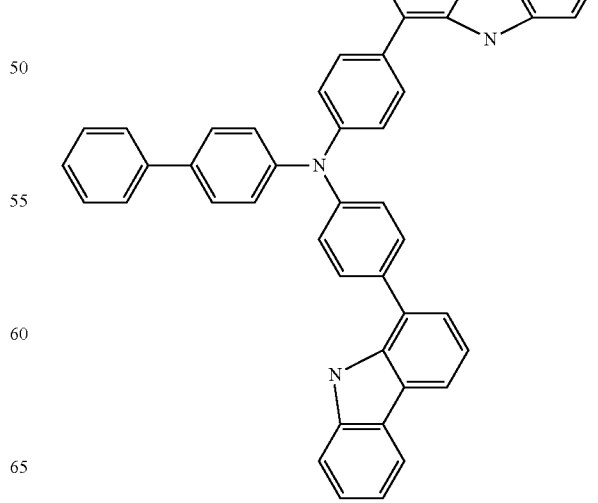

Chemical Formula 2-4

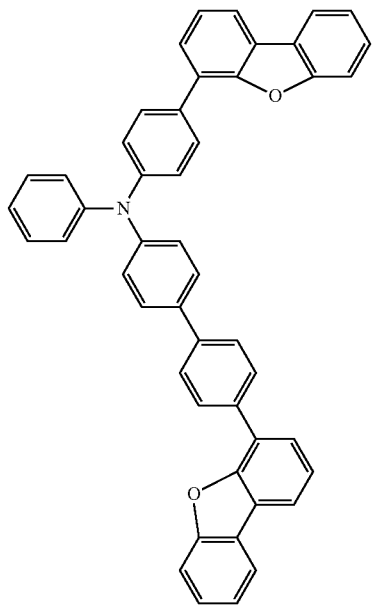

Chemical Formula 2-5

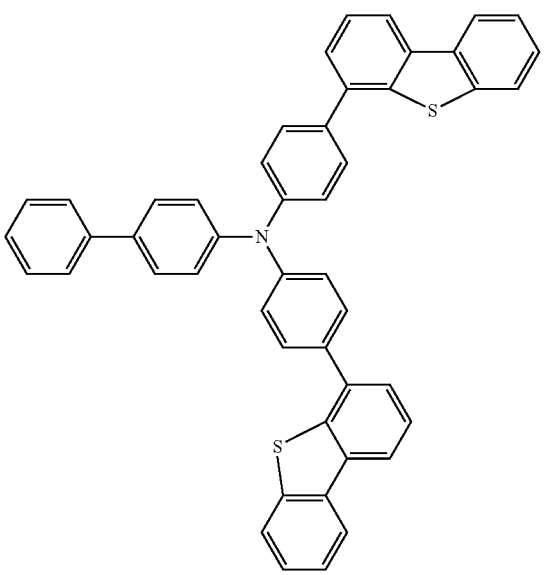

Chemical Formula 2-6

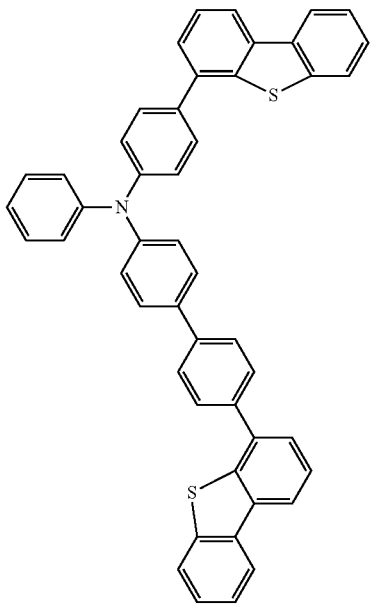

In another exemplary embodiment, the auxiliary layer (BIL) may include a compound represented by Chemical Formula 3.

Chemical Formula 3

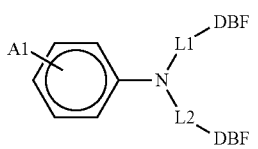

In Chemical Formula 3, A1 may be an alkyl group, an aryl group, carbazole, dibenzothiophene, or dibenzofuran (DBF), L1 and L2 may be

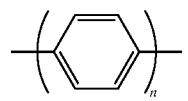

(wherein n is 0 to 3), and DBF connected to L1 and L2 may be replaced by carbazole or dibenzothiophene.

Hereinafter, a composition method of the auxiliary layer (BIL) according to an exemplary embodiment of the present disclosure will be described. For example, the composition method of the following Chemical formula 1-1 will be described.

Chemical Formula 1-1

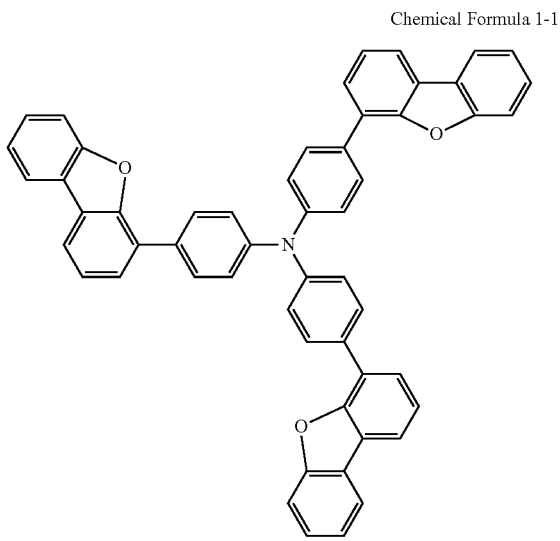 [SMILES: c1ccc2c(c1)oc1c(-c3ccc(N(c4ccc(-c5cccc6c5oc5ccccc56)cc4)c4ccc(-c5cccc6c5oc5ccccc56)cc4)cc3)cccc12]

Composition Example

Under an argon atmosphere, 4-dibenzofuran boronic acid at 6.3 g, 4,4',4"-tribromotriphenylamine at 4.8 g, tetrakis (triphenylphosphine)palladium (Pd(PPh$_3$)$_4$) at 104 mg, a sodium carbonate (Na$_2$CO$_3$) solution at 48 ml (2 M), and toluene at 48 ml were put in a 300 ml 3-neck flask, and reacted at 80° C. for eight hours. The reaction solution was extracted with toluene/water, and dried with anhydrous sodium sulfate. The resultant was condensed under low pressure, and 3.9 g of a yellowish-white powder was obtained through column purification of the obtained crude product.

In FIG. 4, a red resonant auxiliary layer (R') may be disposed below the red light-emitting layer (R), and a green resonant auxiliary layer (G') may be disposed below the green light-emitting layer (G). The red resonant auxiliary layer (R') and the green resonant auxiliary layer (G') are layers that are added in order to adjust a resonant distance for each color. A resonant auxiliary layer may not be formed below the blue light-emitting layer (B) and the auxiliary layer (BIL).

The contents described above with respect to FIGS. 1 to 3, as well as the above-described difference, may be applied to the exemplary embodiment of FIG. 4.

Figure 5:
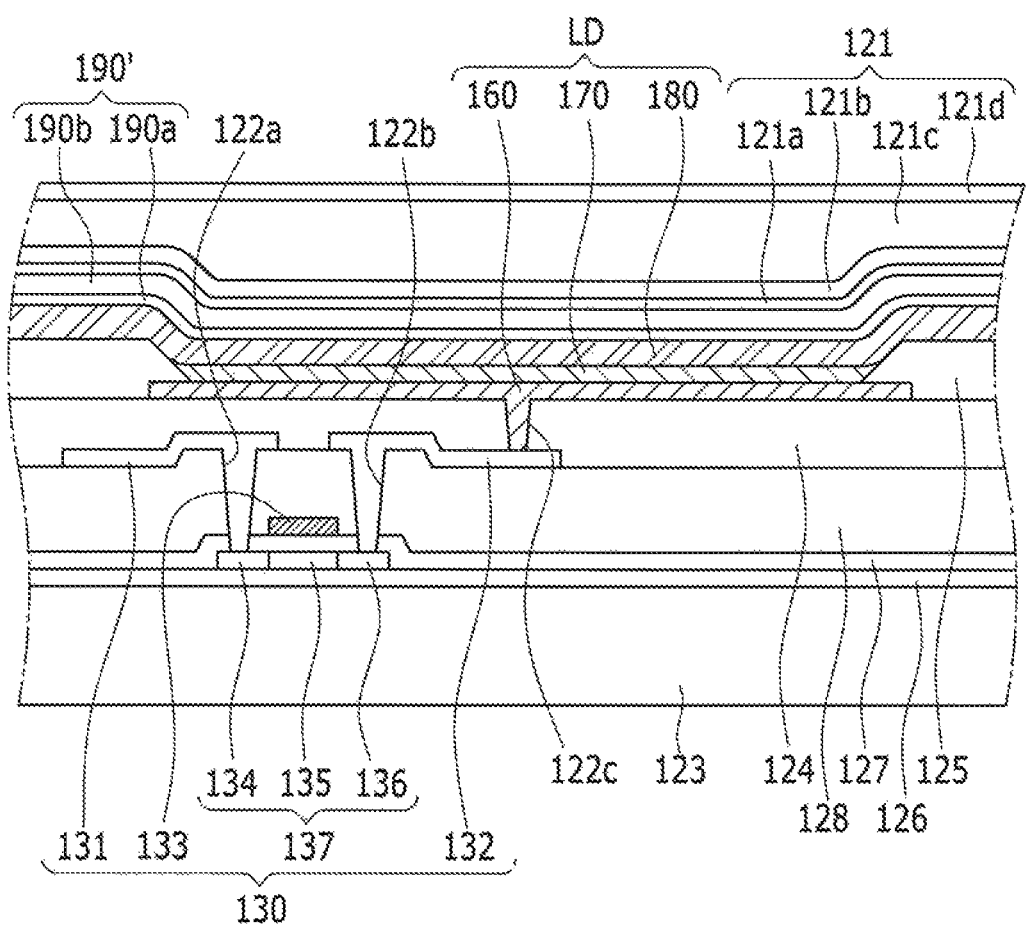
FIG. 5 illustrates a cross-sectional view of another exemplary embodiment in which a capping layer of the organic light emitting diode display of FIG. 2 is partially modified.

FIG. 5 illustrates a cross-sectional view of another exemplary embodiment in which the capping layer of the organic light emitting diode display of FIG. 2 is partially modified.

In the exemplary embodiment of FIG. 5, a capping layer 190' includes multiple layers with different refractive indexes. The capping layer 190' improves light efficiency by increasing an extraction rate of light emitted from the light-emitting diode layer 170 of the organic light emitting diode LD.

In one embodiment, the capping layer 190' has a structure in which a low refraction layer 190a and a high refraction layer 190b are alternately stacked. Although one low refraction layer 190a and one high refraction layer 190b are shown in FIG. 5, embodiments of the capping layer 190' are not limited thereto, and the capping layer 190' may be formed as three or more layers, including one or more of the low refraction layer 190a and one or more of the high refraction layer 190b.

In the present exemplary embodiment, the low refraction layer 190a may include an inorganic material with a refractive index which is equal to or greater than about 1.0 and equal to or less than about 1.7. An inorganic material used in the low refraction layer 190a may include a halogen compound. For example, the inorganic material used in the low refraction layer 190a may include at least one selected from the group consisting of MgF$_2$, LiF, AlF$_3$, and NaF. However, the inorganic material used in the low refraction layer 190a is not limited thereto, and the low refraction layer 190a may include a Group I, Group II, lanthanide, or transition metal based halogen compound, for example, KF, PbF, CaF$_2$, SrF$_2$, YbF$_2$, and the like.

The high refraction layer 190b is disposed on the farthest top layer from the organic light emitting diode LD. That is, in one embodiment, the high refraction layer 190b is the topmost layer of the capping layer 190'. However, in another embodiment, the topmost layer of the capping layer 190' may be the low refraction layer. This is because it is possible to form a three-layered structure of low refraction layer/high refraction layer/low refraction layer according to an exemplary variation of the present exemplary embodiment.

The high refraction layer 190b may include an inorganic material with a refractive index which is equal to or greater than about 1.7 and equal to or less than about 6.0.

An inorganic material used in the high refraction layer 190b may, for example, include at least one selected from the group consisting of CuI, thallium iodide (TlI), BaS, Cu$_2$O, CuO, BiI, and WO$_3$. However, the high refraction layer 190b is not limited to the above-described exemplary embodiment, and the high refraction layer 190b may include at least one selected from the group consisting of TiO$_2$, AgI, CdI$_2$, HgI$_2$, SnI$_2$, PnI$_2$, BiI$_3$, ZnI$_2$, MoO$_3$, Ag$_2$O, CdO, CoO, Pr$_2$O$_3$, SnS, PbS, CdS, CaS, ZnS, ZnTe, PbTe, CdTe, SnSe, PbSe, CdSe, AlAs, GaAs, InAs, GaP, InP, AlP, AlSb, GaSb, and InSb.

In the present exemplary embodiment, the low refraction layer 190a has a thickness of about 100 angstroms to about 400 angstroms, and the high refraction layer 190b has a thickness of about 400 angstroms to about 800 angstroms. When the low refraction layer 190a and the high refraction layer 190b respectively have the above-described thicknesses, efficiency of light which is emitted from the light-emitting diode layer 170 and passes through the capping layer 190' may increase by at least 90%. However, the thicknesses of the capping layer 190' according to the exemplary embodiment of the present disclosure are not limited thereto. That is, thicknesses of the low refraction layer 190a and the high refraction layer 190b may be appropriately adjusted, as necessary.

One portion of light emitted from the light-emitting diode layer 170 by a refractive index difference between the low refraction layer 190a and the high refraction layer 190b of the capping layer 190' may transmit through the capping layer 190', and the other portion thereof may be reflected from the capping layer 190'. Specifically, light is reflected from an interface between the low refraction layer 190a and the high refraction layer 190b, or an interface between the high refraction layer 190b and the base layer 121a.

Light reflected from the capping layer 190' is again reflected from the first electrode 160 or the second electrode 180, and this process is repeated, thereby amplifying light. Further, reflection of light may be repeated inside the capping layer 190', thereby amplifying light. That is, reflection of light may be repeated between the interface between the low refraction layer 190a and the high refraction layer 190b and the interface between the high refraction layer 190b and the base layer 121a.

The organic light emitting diode display according to the exemplary embodiment of the present disclosure may effectively amplify light through such resonance effect, thereby improving light efficiency.

Since light is reflected from each of the interface between the low refraction layer 190a and the high refraction layer 190b and the interface between the high refraction layer 190b and the base layer 121a due to the refractive index difference between the low refraction layer 190a and the high refraction layer 190b and the refractive index difference between the high refraction layer 190b and the base layer 121a, the low refraction layer 190a and the high refraction layer 190b preferably have different refractive indexes. The base layer 121a, which directly contacts the high refraction layer 190b, may be formed of a low refractive material.

Therefore, each of the low refraction layer 190a and the high refraction layer 190b has a refractive index of a range (e.g., a predetermined range) based on a refractive index of the base layer 121a and characteristics of a material that is used for manufacturing each of the refraction layers 190a and 190b. That is, the refractive index of the high refraction layer 190b may be equal to or greater than about 1.7 and equal to or less than about 6.0 depending on the component of the high refraction layer 190b. The refractive index of the low refraction layer 190a may be equal to or greater than about 1.0 and less than about 1.7 depending on the component of the low refraction layer 190a. In this case, even if the low refraction layer 190a and the high refraction layer 190b are formed of the same material, their refractive indexes may be different from each other depending on a manufacturing method thereof.

The contents described with respect to FIG. 2, as well as the above-described difference, may be applied to the exemplary embodiment of FIG. 5.

As described in the exemplary embodiment of the present disclosure, compared to the capping layer that is formed of an inorganic material, and the top layer of which is designed to have a refractive index different from that of the base layer of the thin film encapsulation layer, Table 1 represents changes of light efficiency of the capping layer formed of an organic material.

material such as Balq. In this case, each of the first organic material and the second organic material may be a material applied to a conventional manufactured capping layer among organic materials having a refractive index of about 1.88 to about 1.90. Light efficiency of Comparative Examples 1 and 2 that are the capping layers formed of the organic material are respectively measured at about 0.84 and about 0.91, while light efficiency of Exemplary Embodiments 1, 2, 3, and 4 increases. In Table 1, an acryl-based organic material is used as the organic material of the second encapsulation layer. In this case, the acryl-based organic material may be an ultraviolet ray-hardened type of organic material.

An epoxy-based organic material may be used instead of the acryl-based organic material.

While this disclosure has been described in connection with what are presently considered to be some practical exemplary embodiments, it is to be understood that the disclosure is not limited to the disclosed embodiments, but, on the contrary, is intended to cover various modifications and equivalent arrangements included within the spirit and scope of the appended claims and equivalents thereof.

What is claimed is:

1. An organic light emitting diode display comprising:
   a substrate;
   an organic light emitting diode on the substrate;
   a capping layer on the organic light emitting diode and including a high refractive layer comprising an inorganic material having a refractive index that is equal to or greater than about 1.7 and equal to or less than about 6.0; and
   a thin film encapsulation layer covering the capping layer and the organic light emitting diode, and
   wherein the inorganic material comprises at least one selected from the group consisting of CuI, thallium iodide (TlI), BaS, $Cu_2O$, CuO, BiI, AgI, $CdI_2$, $HgI_2$, $SnI_2$, $PbI_2$, $BiI_3$, $ZnI_2$, $Ag_2O$, CdO, CoO, $Pr_2O_3$, SnS, CdS, CaS, ZnTe, CdTe, SnSe, CdSe, AlAs, GaAs, InAs, GaP, InP, AlP, AlSb, GaSb, and InSb, wherein the capping layer is a single layer.

2. The organic light emitting diode display of claim 1, wherein:

TABLE 1

|  |  | Comparative Example 1 | Comparative Example 2 | Exemplary Embodiment 1 | Exemplary Embodiment 2 | Exemplary Embodiment 3 | Exemplary Embodiment 4 |
|---|---|---|---|---|---|---|---|
| Thin film encapsulation layer | Third encapsulation layer | SiNx | SiNx | SiNx | SiNx | SiNx | SiNx |
|  | Second encapsulation layer | Organic material | Organic material | Organic material | Organic material | Organic material | Organic material |
|  | First encapsulation layer | SiON | SiON | SiNx | SiON | SiON | SiNx |
|  | Base layer | LiF | LiF | LiF | LiF | LiF | LiF |
| Capping layer | Upper layer | Organic material 1 | Organic material 2 | TiOx | CuI | CuI | CuI |
|  | Lower layer | — | Balq | — | — | $AlF_3$ | $AlF_3$ |
|  | Relative light efficiency | 0.84 | 0.91 | 1.01 | 0.93 | 0.98 | 1.03 |

Referring to Table 1, Comparative Example 1 is a capping layer that is formed as a single layer with a first organic material, and Comparative Example 2 is a capping layer that is formed as a two-layered structure with a second organic the capping layer comprises a top layer directly below the thin film encapsulation layer, the thin film encapsulation layer comprises a base layer directly on the capping layer; and the top layer and the base layer have different refractive indexes from each other.

3. The organic light emitting diode display of claim 2, wherein:

the thin film encapsulation layer comprises a first encapsulation layer on the base layer, a second encapsulation layer on the first encapsulation layer, and a third encapsulation layer on the second encapsulation layer; and the first encapsulation layer is an inorganic layer; the second encapsulation layer is an organic layer; and the third encapsulation layer is an inorganic layer.

4. The organic light emitting diode display of claim 3, wherein the base layer comprises at least one selected from the group consisting of LiF, SiOx, SiC, $MgF_2$, $AlF_3$, and NaF.

5. The organic light emitting diode display of claim 4, wherein the first encapsulation layer comprises at least one selected from the group consisting of SiON, $TiO_2$, and SiNx.

6. The organic light emitting diode display of claim 5, wherein the third encapsulation layer comprises at least one selected from the group consisting of SiON, SiNx, and $TiO_2$.

7. The organic light emitting diode display of claim 1, wherein:

the organic light emitting diode comprises a first electrode and a second electrode facing each other, and a light-emitting layer between the first electrode and the second electrode; and the capping layer is directly on the second electrode.

8. The organic light emitting diode display of claim 7, wherein the first electrode comprises a reflective layer.

9. The organic light emitting diode display of claim 8, wherein the thin film encapsulation layer covers a lateral surface of the capping layer.

10. The organic light emitting diode display of claim 9, wherein the light-emitting layer comprises a red light-emitting layer, a green light-emitting layer, a blue light-emitting layer, and an auxiliary layer that is below the blue light-emitting layer.

11. The organic light emitting diode display of claim 10, further comprising a red resonant auxiliary layer below the red light-emitting layer and a green resonant auxiliary layer below the green light-emitting layer.

12. The organic light emitting diode display of claim 10, wherein the auxiliary layer comprises a compound represented by Chemical Formula 1:

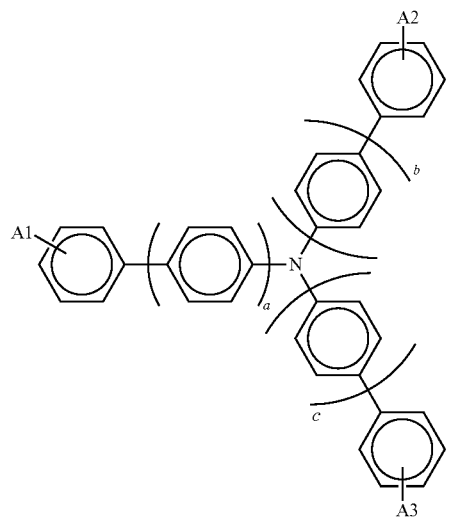

Chemical Formula 1 wherein, in Chemical Formula 1, A1, A2, and A3 are each independently selected from the group of an alkyl group, an aryl group, carbazole, dibenzothiophene, dibenzofuran (DBF), and biphenyl, and a, b, and c are each numbers of zero to four.

13. The organic light emitting diode display of claim 10, wherein the auxiliary layer comprises a compound represented by Chemical Formula 2:

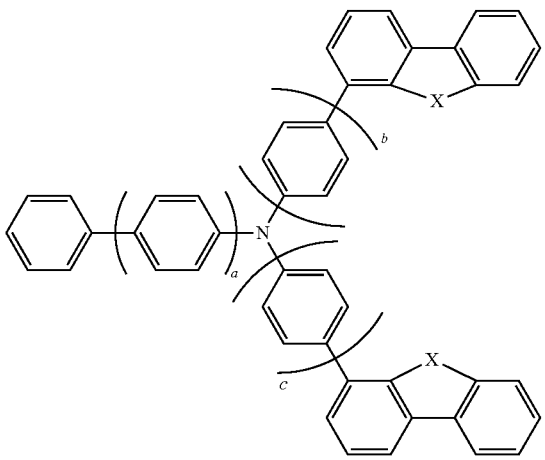

Chemical Formula 2 wherein, in Chemical Formula 2, a is 0 to 3, b and c are respectively 0 to 3, X is selected from O, N, or S, and each X is the same as the other or different than the other.

* * * * *